United States Patent
Soe

(10) Patent No.: US 8,487,695 B2
(45) Date of Patent: Jul. 16, 2013

(54) DIFFERENTIAL SOURCE FOLLOWER HAVING 6DB GAIN WITH APPLICATIONS TO WIGIG BASEBAND FILTERS

(75) Inventor: Zaw Soe, Encinitas, CA (US)

(73) Assignee: Tensorcom, Inc., Carlsbad, CA (US)

( * ) Notice: Subject to any disclaimer, the term of this patent is extended or adjusted under 35 U.S.C. 154(b) by 38 days.

(21) Appl. No.: 13/243,880

(22) Filed: Sep. 23, 2011

(65) Prior Publication Data

US 2013/0076434 A1  Mar. 28, 2013

(51) Int. Cl.
  *H03F 3/45*  (2006.01)
(52) U.S. Cl.
  USPC ........... 327/563; 327/562; 330/253; 330/255; 330/261
(58) Field of Classification Search
  None
  See application file for complete search history.

(56) References Cited

U.S. PATENT DOCUMENTS

| | | | |
|---|---|---|---|
| 4,442,410 A * | 4/1984 | Daniel | 330/289 |
| 4,843,341 A | 6/1989 | Hosticka et al. | |
| 5,264,736 A | 11/1993 | Jacobson | |
| 5,361,041 A * | 11/1994 | Lish | 330/255 |
| 5,396,128 A | 3/1995 | Dunning et al. | |
| 5,589,783 A | 12/1996 | McClure | |
| 5,959,504 A | 9/1999 | Wang | |
| 6,057,714 A | 5/2000 | Andrys et al. | |
| 6,590,430 B2 * | 7/2003 | Sendelweck | 327/99 |
| 6,646,508 B1 * | 11/2003 | Barbetta | 330/264 |
| 6,801,090 B1 | 10/2004 | Abernathy | |
| 6,937,071 B1 | 8/2005 | Moraveji | |
| 6,980,055 B2 * | 12/2005 | Gharpurey | 330/257 |
| 7,181,180 B1 | 2/2007 | Teo et al. | |
| 7,486,145 B2 | 2/2009 | Floyd et al. | |
| 7,528,656 B2 * | 5/2009 | Lee et al. | 330/255 |
| 7,897,484 B2 | 3/2011 | Kar-Roy et al. | |
| 8,004,361 B2 | 8/2011 | Lin | |
| 8,138,835 B2 * | 3/2012 | Zeng et al. | 330/296 |

(Continued)

FOREIGN PATENT DOCUMENTS

WO  2011/107159  9/2011

OTHER PUBLICATIONS

Chen, M; Wang, K H; Zhao, D; Dai, L; Soe, Z; Rogers, P. "A CMOS Bluetooth Radio Transceiver Using a Sliding-IF Architecture", IEEE 2003 Custom Integrated Circuits Conference, pp. 455-458.

(Continued)

*Primary Examiner* — Lincoln Donovan
*Assistant Examiner* — Terry L Englund
(74) *Attorney, Agent, or Firm* — Thaddeus Gabara; Tyrean Patent Prosecution Law Firm

(57) ABSTRACT

A differential amplifier comprising a first upper device and a first lower device series coupled between two power supplies and a second upper device and a second lower device series coupled between the two power supplies. A first DC voltage enables the first upper device and the second upper device and a second DC voltage regulates current flow in the first lower device and the second lower device. An AC signal component is coupled to the first upper device and the second lower device while the AC signal complement is coupled to the first lower device and the second upper device. A first output signal between the first upper device and the first lower device. Separate RC networks couple the AC signals to their respective device. A first and second output signal forms between the upper device and the lower device, respectively. All the devices are same channel type.

9 Claims, 10 Drawing Sheets

U.S. PATENT DOCUMENTS

| | | |
|---|---|---|
| 2005/0206412 A1 | 9/2005 | Moraveji |
| 2007/0090877 A1 | 4/2007 | Bagheri et al. |
| 2007/0115086 A1 | 5/2007 | Molins |
| 2010/0013557 A1 | 1/2010 | Cao |
| 2010/0039092 A1 | 2/2010 | Cordier et al. |
| 2012/0319673 A1 | 12/2012 | Tham et al. |

OTHER PUBLICATIONS

Wikipedia "Sallen-Key topology", http://en.wikipedia.org/wiki/Sallen-Key_topology, Copied [Oct. 6, 2011 5:35:09 PM], pp. 1-8.

47 CFR § 15.255 Operation within the band 57-64 GHz.

* cited by examiner

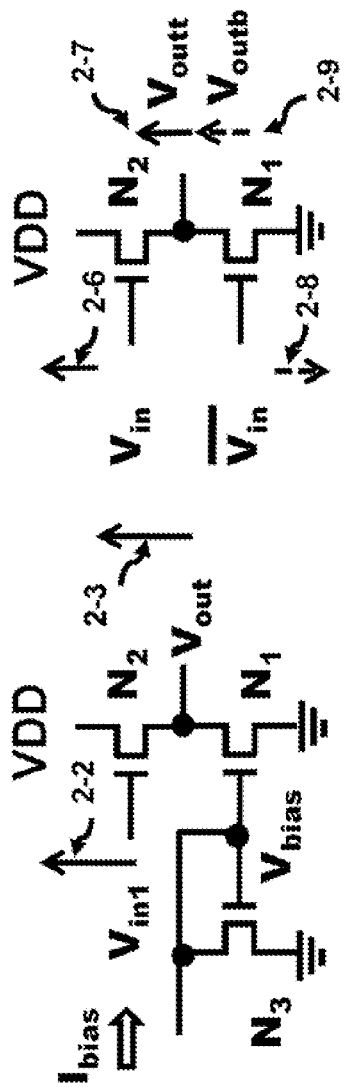
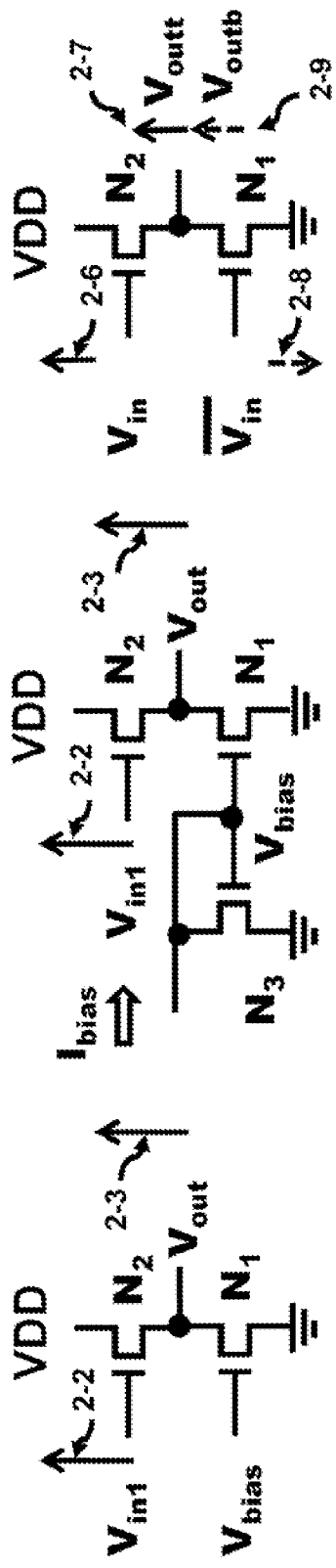
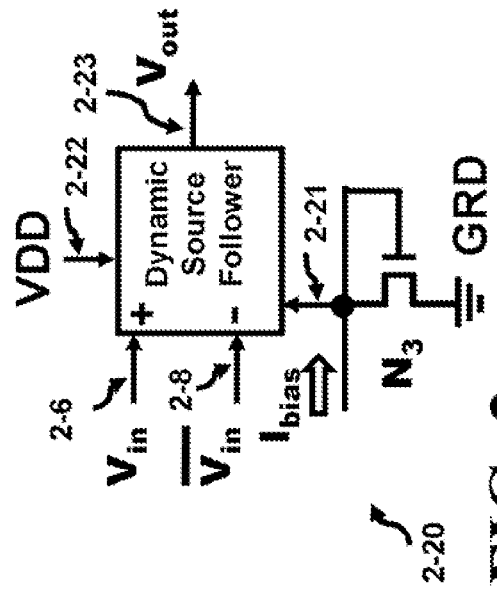
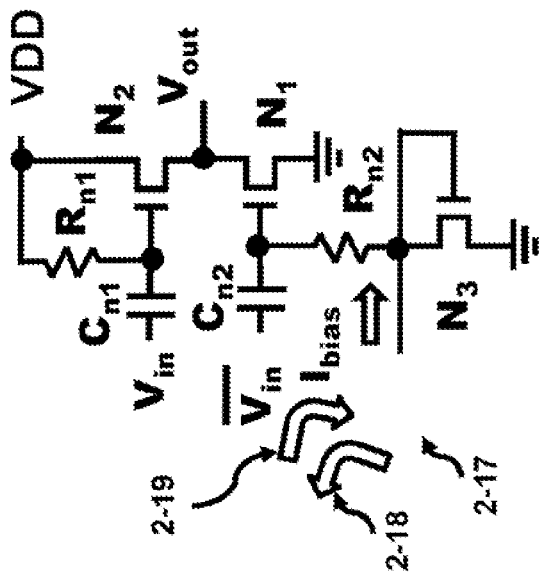
FIG. 2a
FIG. 2b
FIG. 2c
FIG. 2d
FIG. 2e

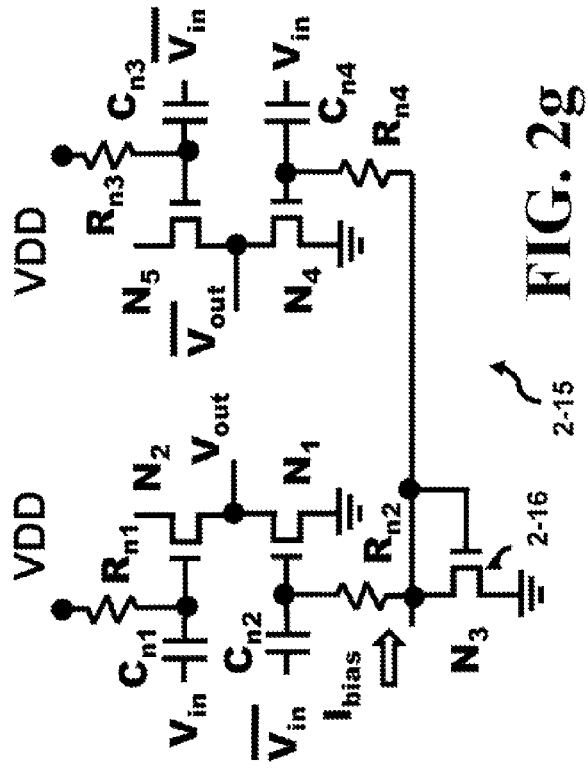
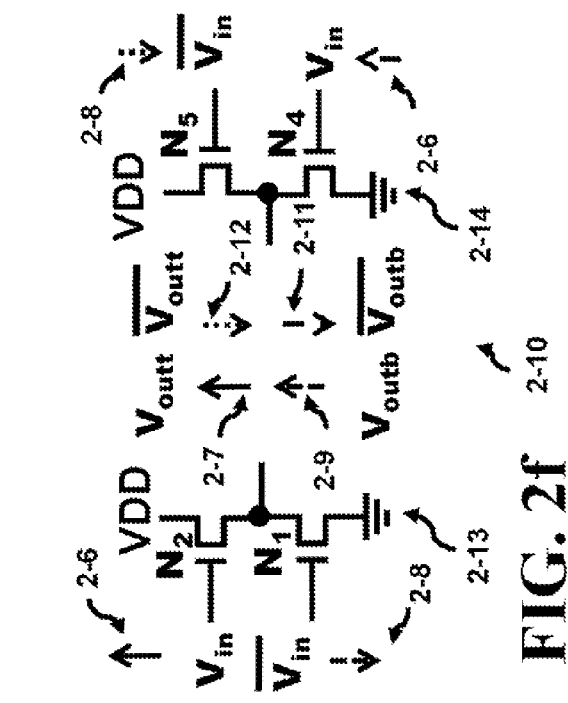
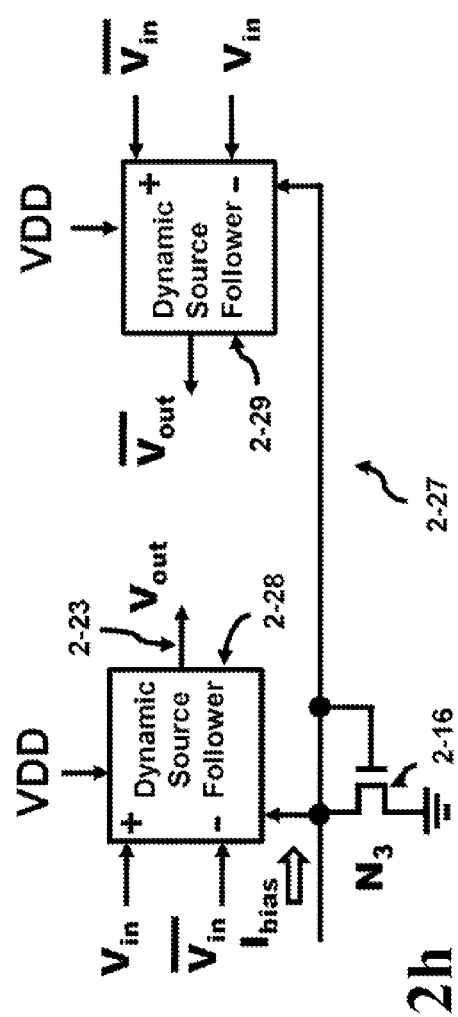
FIG. 2f
FIG. 2g
FIG. 2h

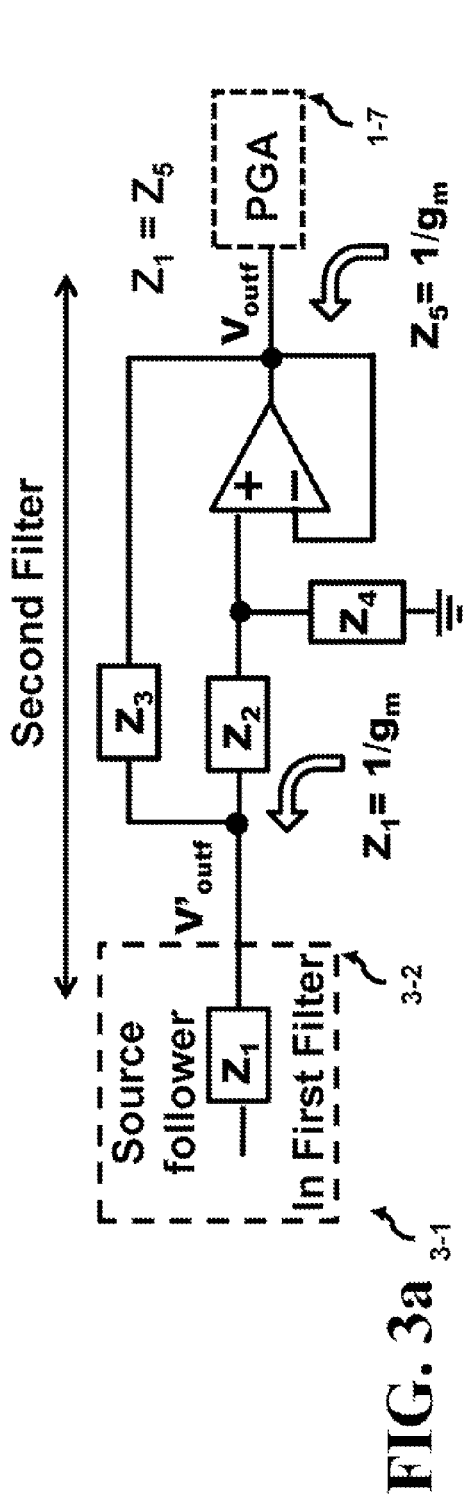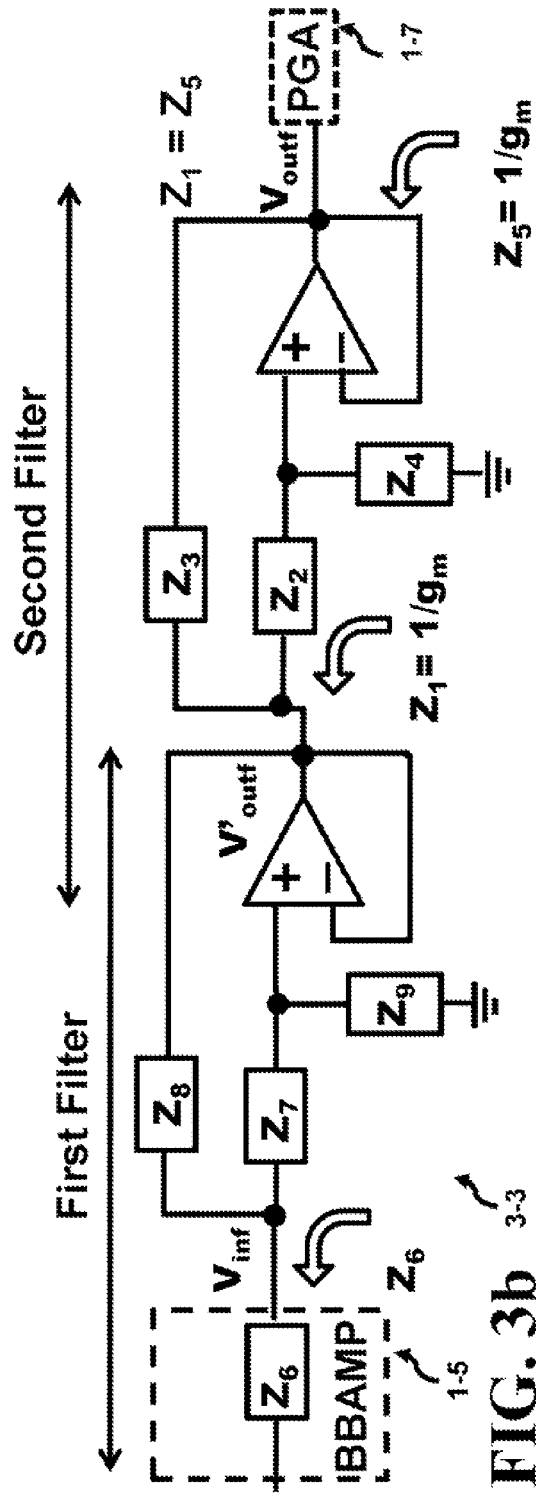
FIG. 3a
FIG. 3b

US 8,487,695 B2

DIFFERENTIAL SOURCE FOLLOWER HAVING 6DB GAIN WITH APPLICATIONS TO WIGIG BASEBAND FILTERS

CROSS REFERENCE TO RELATED APPLICATIONS

The present application is related to the co-filed U.S. application Ser. No. 13/243,908 filed on the same day herewith entitled "A High Performance Divider Using Feed Forward, Clock Amplification and Series Peaking Inductors", and the co-filed U.S. application Ser. No. 13/243,986, now issued as U.S. Pat. No. 8,406,710, filed on the same day herewith entitled "Method and Apparatus of Minimizing Extrinsic Parasitic Resistance in 60 *GHz Power Amplifier Circuits"* both filed on Sep. 23, 2011, which are invented by the same inventor as the present application and incorporated herein by reference in their entireties.

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS) or Silicon-Germanium (Site) technology to form the dice in these designs. At 60 GHz, achieving the desired parameters of gain (G), bandwidth (BW) and noise figure (NF) present difficult challenges. These parameters can be traded against the other in the design of these high frequency circuits.

A source follower, also known as a common drain amplifier, is a circuit configuration of an active device that is used in circuit designs to provide a voltage buffer or to transform impedances. A CMOS source follower circuit provides high input impedance, moderate current gain, low output impedance and a voltage gain approaching one Such a device can be fabricated using the CMOS 40 nm technology designed to operate at a VDD of 1.2V.

A Sallen-Key topology is a second-order active filter that presents a finite input impedance and a small output impedance in its external filter characteristics. The filters can be designed as a low-pass, band-pass or high-pass filter. Such active filters avoid the use of inductors which can consume large areas in integrated circuits. A higher filter gain is achieved by cascading two or more Sallen-Key filter stages.

BRIEF SUMMARY OF THE INVENTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

As the power supply voltage reduces in the scaling of integrated circuits, the voltage headroom for analog integrated circuits decreases correspondingly. This makes the design of high performance systems in a low power supply integrated circuit much more challenging. A source follower amplifier can be formed from two series stacked devices coupled between the VDD and GRD where one device translates the input signal (active device) while the second device is the load (load device). For example, a CMOS source follower is formed by placing two series stacked n-channel (NMOS) devices coupled between VDD and GRD with the lower device presenting a controlled current load to the upper device that is driven by the input. If the supply voltage (VDD-GRD) is 1.2V, the headroom, or available output signal swing, is an important concern. With only two devices between the power supplies, the source follower generates an output signal with a maximum voltage swing of 400 mV to 500 mV. This maximum voltage swing is called the headroom.

One of the embodiments of the disclosure modifies the load device in a source follower so that the load device also allows the introduction an input signal that enhances the gain of the source follower. Thus, the load device provides a DC (Direct Current) bias to operate the source follower and introduces an AC (Alternating Current) gain when the load device is driven by a signal with the proper phase (180°) compared to the signal being applied to the active device. The AC voltage gain of the load device is added constructively to the AC voltage gain of the conventional source follower to provide an improvement in the gain of the source follower by 6 dB. Thus, the AC voltage gain of a source follower using this inventive concept can be increased from 0 dB to 6 dB.

Another one of the embodiments of the disclosure is to incorporate the source follower with AC voltage in the load device into a differential amplifier configuration. A differential configuration amplifies an AC input signal and a complement AC input signal and generates an AC output signal and a complement AC output signal. The complement AC input signal is phase shifted 180° from the AC input signal and the complement AC output signal is phase shifted 180° from the AC output signal. The complement AC output signal is also referred as an inverse AC output signal. Overall, the gain of the source follower differential amplifier can be as large as a 6 dB gain.

A different one of the embodiments of the disclosure is to incorporate the source follower into the design of a Sallen-Key filter. The operational amplifier 1-15 in the Sallen-Key filter in FIG. 1*b* limits the high frequency behavior of the filter. The inventive source follower can significantly extend the range of the high frequency behavior of this filter. This source follower has input/output characteristics similar to that of the operational amplifier. The operational amplifier presents infinite input impedance, good current drive and a small output impedance at its input and output terminals. Similarly, the source follower has attributes that include having a high input impedance, good current drive and a low output impedance at its input and output terminals. The operational amplifier is replaced with the source follower and is utilized to create a Sallen-Key filter that provides an 880 MHz bandwidth filter. The source follower itself would require an overall bandwidth of 8.8 GHz to achieve this filter bandwidth. A conventional operational amplifier is typically uses two cascaded stages and requires a negative feedback network to compensation for any potential stability issues. Such additional networks increase capacitance, increase die area, and limits high frequency performance. However, the source follower uses a single stage using two series coupled devices between VDD and GRD and furthermore does not require a negative feedback network. These features allow the Sallen-Key filter with the source follower to have a bandwidth that can filter baseband WiGig signals. The WiGig signal content is within a bandwidth of 0 to 880 MHz. The inventive technique removes the first 2 MHz by the use of an RC network but does not cause any performance degradation.

In accordance with another embodiment of the invention, the features of the differential signal output stage using the first and second source follower stages are advantageously leveraged to form the Sallen-Key filter topology. The overall front end gain of the receiver of the LNA, Mixer and Base-Band amplifier of devices fabricated at 40 nm CMOS fails to deliver the desired gain to design a receiver that can operate with 60 GHz signals at low power. Additional gain was required in the RF link. The Sallen-Key LPF (Low Pass Filter) uses the inventive source followers to provide 6 dB of AC voltage gain per differential signal. Furthermore, two Sallen-Key LPFs are concatenated in series to provide 12 dB of additional AC voltage gain. Other aspects and features of the inventions are also presented.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 2a shows a two device source follower in accordance with the present invention.

FIG. 2b presents the current mirror generating the voltage bias in accordance with the present invention.

FIG. 2c depicts a 6 dB AC voltage gain in a source follower in accordance with the present invention.

FIG. 2d illustrates the 6 dB AC voltage gain in a source follower with RC networks in accordance with the present invention.

FIG. 2e shows the current source and a dynamic source follower block in accordance with the present invention.

FIG. 2f illustrates a differential source follower with 6 dB of AC voltage gain in accordance with the present invention.

FIG. 2g shows a differential source follower with the biasing and RC networks in place in accordance with the present invention.

FIG. 2h presents FIG. 2e with dynamic source follower blocks in accordance with the present invention.

FIG. 3a presents the two pole Sallen-Key filter in accordance with the present invention.

FIG. 3b presents a cascaded two pole Sallen-Key filter in accordance with the present invention.

DETAILED DESCRIPTION OF THE INVENTION

Figure 1A:
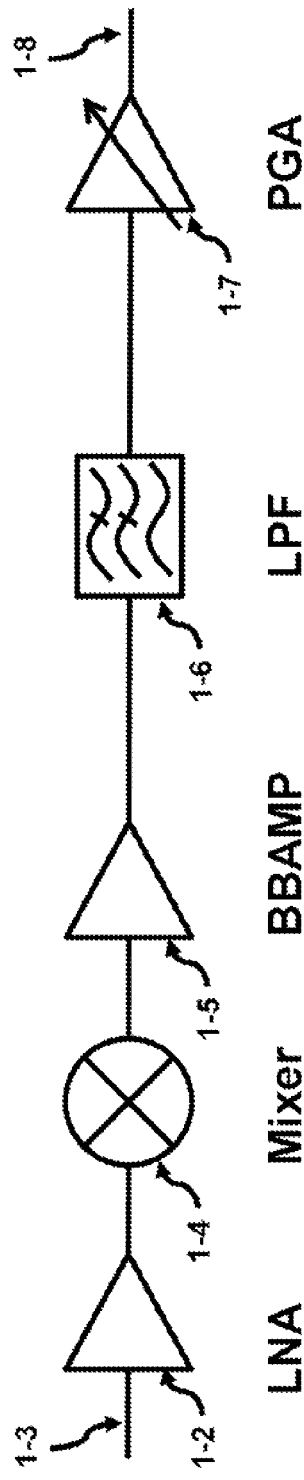
FIG. 1a depicts an on-chip RF link.

The inventions presented in this specification can be used in any wired or wireless high frequency system design. One application of the inventions can be applied to the front end of a receiver circuit 1-1 as illustrated in FIG. 1a. The Low Noise Amplifier (LNA) 1-2 can receive a weak signal at its input 1-3. This signal may have been be provided by an antenna or a wired line and is amplified by the LNA and applied to the Mixer 1-4. The CMOS design of an LNA at millimeter waves with a gain greater than 30 dB is very difficult. Afterwards, the signal is demodulated into a baseband signal. The baseband signal is amplified by the Base Band Amplifier (BBAMP) 1-5 and sent to the Low Pass Filter (LPF) 1-6. The LPF filters the signal and also provides an additional gain before the signal is sent to the Programmable Gain Amplifier (PGA) 1-7 which generates an output 1-8. In either case, the weak signal is amplified, demodulated, amplified, filtered and amplified as an output 1-8 before being applied to an A/D (Analog to Digital) convertor (not shown). The block diagram can be operated using a single signal stream or differential signal stream.

Figure 1C:
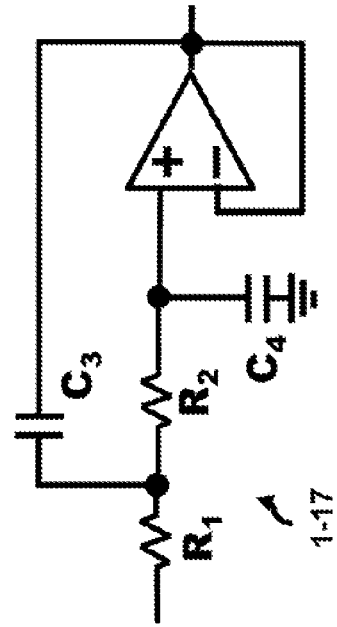
FIG. 1c illustrates a low-pass Sallen-Key filter.
Figure 1B:
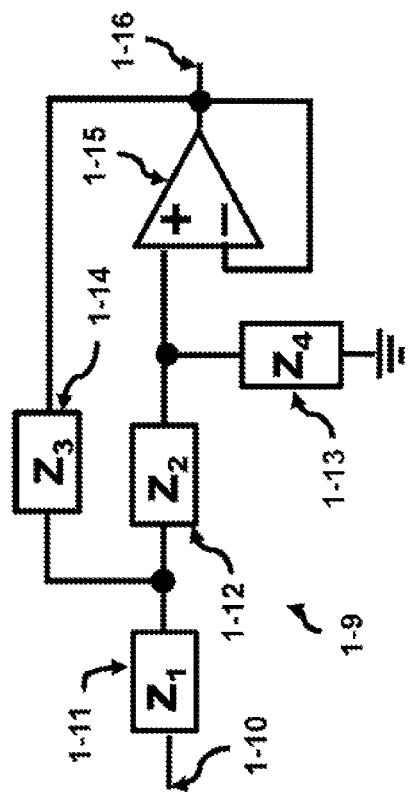
FIG. 1b illustrates a Sallen-Key filter.

FIG. 1b illustrates a Sallen-Key filter 1-9 which has a large input impedance and small output impedance. The input 1-10 to the filter is via $Z_1$ 1-11 whose output is coupled to $Z_2$ 1-12 and $Z_3$ 1-14. $Z_3$ 1-14 couples to the output 1-16. $Z_2$ 1-12 is coupled to $Z_4$ 1-13 and the positive input of the operational amplifier 1-15. The other end of $Z_4$ 1-13 is grounded. The output 1-16 is also coupled to the negative input of the operational amplifier 1-15. The operational amplifier offers high gain and allows the construction of a second order filter without the use of inductors. In FIG. 1c, the impedances are replaced with resistors or capacitors in the Sallen-Key filter 1-17 to form a low pass filter.

FIG. 2a depicts two n-channel devices (N-MOS) coupled in series forming a path between the power supplies VDD and GRD (ground). This configuration is known as a source follower. The lower device $N_1$ acts as a load device and is biased by a DC bias voltage $V_{bias}$ while the upper device $N_2$ acts as an active device and is driven by $V_{in1}$ 2-2. The output signal $V_{out}$ 2-3 is in phase (non-inverted) with $V_{in1}$. The AC voltage gain of out $V_{out1}/V_{in1}$ is almost one or 0 dB and behaves very linearly.

FIG. 2b illustrates how the current source is formed using device $N_3$ and $N_1$. A bias current $I_{bias}$ can be applied to the device $N_3$ that is connected in saturation where the gate is connected to the drain. The generated voltage $V_{bias}$ is then applied to the device $N_1$ which scales the current carried in $N_1$ of the stacked devices $N_2$ and $N_1$. The stacked devices form a path between the power supplies. The load device (lower device) and the reference transistor form a current mirror. The active device (upper device) has first signal $V_{in1}$ 2-2 applied to the input. The first signal $V_{in1}$ causes the generation of an output signal $V_{out}$ 2-3 that is in phase with the input signal $V_{in1}$ and has a AC voltage gain approaching one (0 dB). The maximum swing of the output signal $V_{out}$ equals the headroom. Since the gain is 0 dB, the input voltage has a voltage swing equal to the headroom.

In accordance with one inventive concept of the invention, a source follower stage is modified to provide an AC voltage gain that approaches two (6 dB) as illustrated in FIG. 2c. The bias voltage $V_{bias}$ is applied to the load device $N_1$ as before. However, an RC network (not illustrated) provides two functions: 1) in one case the RC network presents a low pass filter that filters the bias voltage $V_{bias}$ applied to $N_1$; and 2) in a second case presents a high pass filter (using the same RC network) to a couple a second input signal $\overline{V_{in}}$ to the load device, simultaneously. The second input signal 2-8, and the filter bias voltage are applied to load device $N_1$. Similarly, the first input signal $V_{in}$ 2-6 is applied to the active device $N_2$ and generates a first output signal component $V_{out}$ 2-7. The load device $N_1$ inverts the signal $\overline{V_{in}}$ 2-8 at its input and generates a second output signal component $V_{outb}$ 2-9. Thus, the active device $N_2$ generates a first output signal component $V_{outt}$ of the output signal that is in phase with the input signal $V_{in}$ and the load device $N_1$ generates the second output signal component $V_{outb}$ of the output signal that is out of phase with the input signal $\overline{V_{in}}$. Since the load device inverts the input signal $\overline{V_{in}}$ and generates a second output signal component of the output signal that is in phase with the first output signal component of the output signal, the overall gain of the active and load devices is in phase causing the first and second output signal components of the output signal to be summed constructively. Note that the summation of $V_{outt}$ 2-7 and $V_{outb}$ 2-9 has an overall maximum amplitude equal to the headroom or in this case the magnitude of $V_{out}$ 2-3. The maximum amplitude of the summation equals the headroom mentioned earlier. However, the input signals $V_{in}$ 2-6 and $\overline{V_{in}}$ 2-8 each have half the magnitude of $V_{in1}$ 2-2. Assuming the magnitude of the AC voltage gain of the active load is almost one while the magnitude of the AC voltage gain of the load device can be designed to be one thereby allowing this inventive source follower stage to have an AC voltage gain equal to 6 dB.

The circuit 2-17 in FIG. 2d illustrates the addition of the RC networks and current source with the bias current to FIG. 2c. Note that the two output voltages $V_{outt}$ 2-7 and $V_{outb}$ 2-9 of FIG. 2c are combined into $V_{out}$ into FIG. 2d, the bias current $I_{bias}$ creates a DC bias voltage across the device $N_3$ and is applied to the device $N_1$ in the first source follower through a low pass filter comprising of $R_{n2}$ and $C_{n2}$ (see arrow 2-18). Assume the impedance of the voltage source $\overline{V_{in}}$ 2-8 is very low, thereby effectively grounding the far end of the capacitor $C_{n2}$ forming the low pass filter. Simultaneously, the high frequency input signal $\overline{V_{in}}$ 2-8 is applied to the load device $N_1$ through the high pass filter comprising the same two components $C_{n2}$ and $C_{n2}$ (see arrow 2-19). The far end of the resistor $R_{n2}$ is coupled to AC ground forming the high pass filter. Thus, the load device $N_1$ is biased to the correct bias voltage and simultaneously the high frequency signal $\overline{V_{in}}$ 2-8 is also applied to the load device $N_1$.

The second RC network of FIG. 2d comprising $R_{n1}$ and $C_{n1}$ also presents a low pass or high pass filter to the input DC bias voltage from VDD and the high frequency signal of $V_{in}$ 2-6. The voltage VDD is applied to the device $N_2$ in the first source follower through a low pass filter comprising of $R_{n1}$ and $C_{n1}$. Assume the impedance of the voltage source $V_{in}$ 2-6 is very low, thereby effectively grounding the far end of the capacitor $C_{n1}$ forming the low pass filter. Simultaneously, the high frequency input signal $V_{in}$ 2-6 and is applied to the load device $N_2$ through the high pass filter comprising the same two components $C_{n1}$ and $R_{n1}$. The far end of the resistor $R_{n1}$ is coupled to AC ground forming the high pass filter. Thus, the load device $N_2$ is biased to the correct DC bias voltage and simultaneously the high frequency signal $V_{in}$ 2-6 and is also applied to the load device $N_2$.

The circuit 2-20 in FIG. 2e depicts the replacement of the inventive source follower and RC networks by the Dynamic Source Follower which has several terminals: VDD 2-22, signal $V_{in}$ 2-6, complementary signal $\overline{V_{in}}$ 2-8, GRD (not shown) and DC bias voltage 2-21. The signal is applied to the positive terminal while the complementary signal is applied to the negative terminal. The output of the Dynamic Source Follower is $V_{out}$ 2-23. By comparing FIG. 2d and FIG. 2e, The Dynamic Source Follower comprises the two series devices $N_1$ and $N_2$ coupled between two power supplies VDD and GRD (ground). In addition, a first RC network $C_{n2}$ and $C_{n2}$ acts as a high pass filter and couples the high frequency components of a first input signal ($\overline{V_{in}}$ 2-8) to the $N_1$ device. The first RC network also acts as a low pass filter and couples a first biasing DC voltage component to the $N_1$ device. The second RC network $C_{n1}$ and $R_{n1}$ acts as a high pass filter and couples the high frequency components of a second input signal ($V_{in}$ 2-6) to the $N_2$ device. The second RC network also acts as a low pass filter and couples a second biasing DC voltage component (from VDD) to the $N_2$ device. An output signal 2-23 is generated at the output of the Dynamic Source Follower.

In accordance with another embodiment of the invention, the differential source follower 2-10 as illustrated in FIG. 2f can offer an overall AC voltage gain of 6 dB and improved noise immunity by extending the inventive concept to a differential network, in accordance with another embodiment of the invention, a differential signal output stage is created by using a first 2-13 and second 2-14 inventive source follower stage forming a differential interface 2-10. The first source follower 2-13 is driven by the signals $V_{in}$ 2-6 and $\overline{V_{in}}$ 2-8 and generates a first output signal by the summation of the generated output signal components $V_{outt}$ 2-7 and $V_{outb}$ 2-9, respectively. The second source follower 2-14 is also driven by the same two input signals $\overline{V_{in}}$ 2-8 and $V_{in}$ 2-6 and but these inputs are applied to the second source follower 2-14 in a complementary manner when compared to the first source follower 2-13. The second source follower 2-14 is driven by the input signals $\overline{V_{in}}$ 2-8 and $V_{in}$ 2-6 to generate the output signal components $\overline{V_{outt}}$ 2-12 and $\overline{V_{outb}}$ 2-11, respectively.

The summation of the output signal components 2-11 and 2-12 has the same magnitude as the summation of the output signal components 2-7 and 2-9, but with a phase reversal since the inputs to the second source follower are flipped. The differential peak to peak AC voltage gain measured between the two outputs of the invention is 6 dB. The AC voltage gain of the differential stage in FIG. 2f is given by equation (1):

$$20 \log\left(\frac{V_{outt} + V_{outb} - \overline{V_{outt}} - \overline{V_{outb}}}{V_{in} - \overline{V_{in}}}\right) \cong 6 \text{ dB} \quad (1)$$

FIG. 2g depicts the circuit 2-15 with RC networks and the current source applied to the circuit shown in FIG. 2f in accordance with another embodiment of the invention. The device $N_3$ 2-16 is connected in a saturation configuration and is part of the current mirror with devices $N_1$ and $N_4$. By scaling the size of the load device $N_1$ with respect to $N_3$ allows the current in the first source follower to be adjusted. Note the bias current $I_{bias}$ creates a DC voltage due to the device $N_3$ and is applied to the device $N_1$ in the first source follower through a low pass filter comprising of $R_{n2}$ and $C_{n2}$; simultaneously, the input signal $\overline{V_{in}}$ 2-8 is applied through the high pass filter to the load device $N_1$ comprising of the same two components $C_{n2}$ and $R_{n2}$. Thus, the load device $N_1$ is biased to the correct voltage and simultaneously the signal $\overline{V_{in}}$ 2-8 is also applied to the load device $N_1$.

The RC network of $R_{n1}$ and $C_{n1}$ in first source follower of FIG. 2g provides a high pass and low pass function for the active device $N_2$. The low pass circuit filters VDD to the active device $N_2$ enabling the n-channel device. Concurrently, the input $V_{in}$ is applied through the RC high pass network of $C_{n1}$ and $R_{n1}$. The second source follower operates in a similar way except that the inputs are applied to the second source follower using complementary inputs.

The differential circuit 2-27 in FIG. 2h depicts the replacement of both of the inventive source follower and RC networks by the Dynamic Source Followers 2-28 and 2-29 which each have several terminals: VDD, signal $V_{in}$, complementary signal $\overline{V_{in}}$, GRD (not shown) and a DC bias voltage. The outputs of the differential Dynamic Source Follower are $V_{out}$ and $\overline{V_{out}}$. By comparing FIG. 2g and FIG. 2h, one of the Dynamic Source Follower 2-28 comprises the two series devices $N_1$ and $N_2$ coupled between two power supplies VDD and GRD (ground). In addition, a first RC network $C_{n2}$ and $R_{n2}$ acts as a high pass filter and couples the high frequency components of a first input signal ($\overline{V_{in}}$) to the $N_1$ device. The first RC network also acts as a low pass filter and couples a first biasing DC voltage component to the $N_1$ device. The second RC network $C_{n1}$ and $R_{n1}$ acts as a high pass filter and couples the high frequency components of a second input signal ($V_{in}$) to the $N_2$ device. The second RC network also acts as a low pass filter and couples a second biasing DC voltage component (from VDD) to the $N_2$ device. An output signal 2-23 is generated at the output of the Dynamic Source Follower. The other Dynamic Source Follower 2-29 operates the same way except that the two inputs $V_{in}$ and $\overline{V_{in}}$ are flipped when compared to 2-28.

The Sallen-Key filter 3-1 is depicted in FIG. 3a which corresponds to a portion of the filter 1-6 in FIG. 1a in accordance with another embodiment of the inventive idea. The second filter cascaded between the output of the first filter and the input to the Programmable Gain Amplifier PGA 1-7. Note that the source follower in the first filter 3-2 provides the low output impedance of $$\frac{1}{g_m}$$

as required for the impedance of $Z_1$ in the second filter. The impedance of $Z_1$ in the second filter is also called the source impedance. The remaining components of the second filter: $Z_2$-$Z_4$ and the operational amplifier are similar to that which was depicted in FIG. 1b.

In accordance with another embodiment of the inventive concept, the FIG. 3b illustrates the first and second Sallen-Key filters cascaded together. The Low Pass Filter LPF 1-6 in FIG. 1a is formed by replacing the impedances with the appropriate capacitors and resistors in FIG. 3b. The LPF is between the BBAMP base band amplifier 1-5 and the Programmable Gain Amplifier PGA 1-7 as shown in FIG. 1a. The output impedance $Z_6$ of the BBAMP at node $V_{inf}$ is designed to provide a low impedance meeting the specification criteria required for the first element of the first filter. This low impedance is also called the source impedance. The output impedance $Z_1$ of the first filter at node $V'_{outf}$ is also provides the low impedance of $$\frac{1}{g_m}$$

which is also first element of the second filter.

Figure 3C:
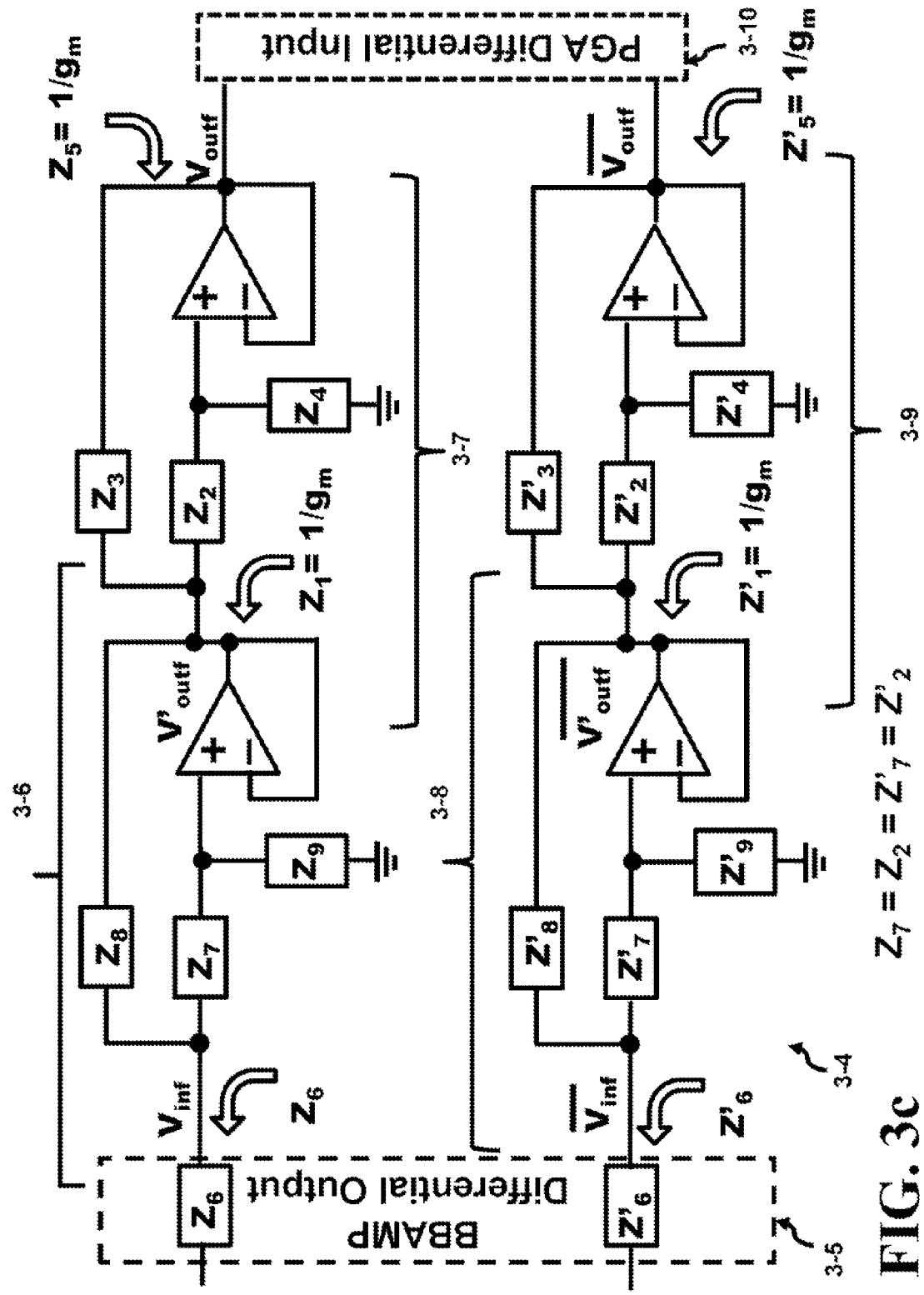
FIG. 3c depicts an implementation of the differential two pole Sallen-Key filter cascaded in accordance with the present invention.

FIG. 3c illustrates the differential Sallen-Key filter 3-4 coupled between the differential outputs of the BBAMP 3-5 at nodes $V_{inf}$ and $\overline{V_{inf}}$ and the differential inputs of the PGA 3-10 at nodes $V_{outf}$ and $\overline{V_{outf}}$. The BBAMP 3-5 provides the low output impedance ($Z_6$ and $Z'_6$) that is required to satisfy the design requirements of the first filters (3-6 and 3-8). Inside the top filter chain are two cascaded Sallen-Key filters 3-6 and 3-7. In between the cascaded filters 3-6 and 3-7, at node $V'_{outf}$ the output impedance of the first filter 3-6 is the input impedance of the second filter 3-7. Similarly, the lower filter chain also contains two Sallen-Key filters 3-8 and 3-9. Identically positioned elements have the same characteristics; for example, the impedances $Z_9$=$Z_4$=$Z'_9$=$Z'_4$.

Figure 4A:
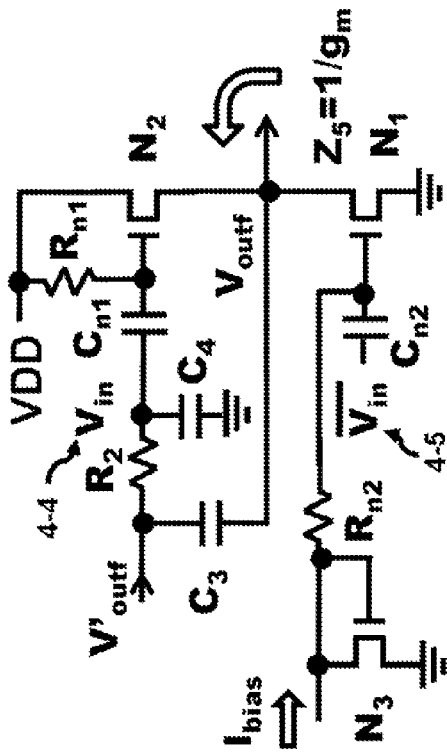
FIG. 4a illustrates the two pole Sallen-Key filter in accordance with the present invention.

FIG. 4a illustrates a Sallen-Key filter 4-1 in accordance with another embodiment of the inventive idea. The resistance $R_1$ is not illustrated but is presented to this circuit when the previous stage is coupled to the input node $V'_{outf}$. The capacitance $C_3$ couples the input signal $V'_{outf}$ to the output signal $V_{outf}$ while the impedances $R_2$ and $C_4$ form a voltage divider between $V'_{outf}$ and GRD (or VSS) generating $V_{in}$. The output signal $V_{outf}$ 4-2 is connected to the negative input of the operational amplifier 1-15. The operational amplifier requires both an input signal $V_{in}$ 4-4 and its complement $\overline{V_{in}}$ 4-5.

Figure 4B:
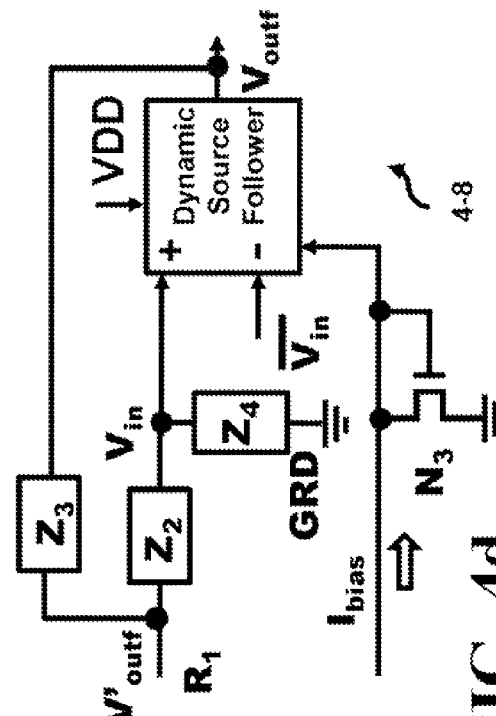
FIG. 4b illustrates the two pole Sallen-Key filter using a source follower as an operational amplifier in accordance with the present invention.

By comparing the equivalent Sallen-Key filter 4-1 depicted in FIG. 4a with the circuit 4-3 in FIG. 4b illustrates that the operational amplifier 1-15 in FIG. 4a can be substituted by the RC networks of $C_{n1}$-$R_{n1}$ and $C_{n2}$-$R_{n2}$ along with the devices $N_1$ and $N_2$ in FIG. 4b. The reason for the substitution is that the output and input impedances of the operational amplifier and the RC networks of $C_{n1}$-$R_{n1}$ and $C_{n2}$-$R_{n2}$ along with the devices $N_1$ and $N_2$ have similar characteristics. Both have a high input impedance and a low output impedance. Furthermore, due to the current mirror formed by $N_3$ and $N_1$, the reference current $I_{bias}$ adjusts the current flow in $N_1$. In turn, the output impedance $Z_5$ or $$\frac{1}{g_m}$$

can be altered by adjusting the current flow through the two series coupled devices $N_1$ and $N_2$.

The distribution of sheet resistance values over process variations causes variations in the desired value of the resistance $R_2$ which can affect the operation of the Sallen-Key filter in the field. To maintain one desired behavior in the filter, the ratio of $R_2$ to $Z_5$ needs to be matched. Since the output impedance of the inventive Sallen-Key filter can be changed by altering the $I_{bias}$ reference current, the current $I_{bias}$ can be adjusted until the value of $$\frac{1}{g_m}$$

or $Z_5$ matches the required ratio compared to $R_2$. Thus, the inventive concept can compensate the filter for process variations.

Figure 4C:
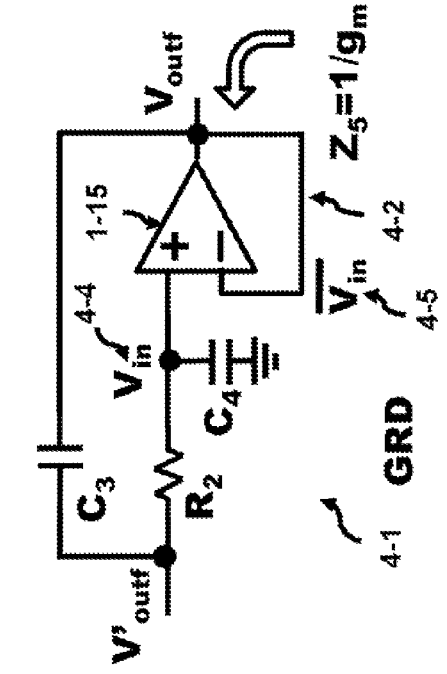
FIG. 4c depicts a low pass Sallen-Key filter as in FIG. 4b replaced with a dynamic source follower block in accordance with the present invention.
Figure 4D:
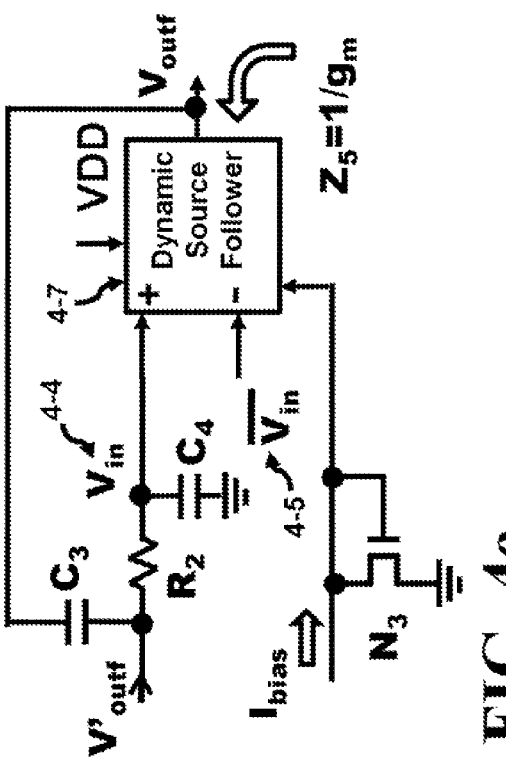
FIG. 4d illustrates a generalized Sallen-Key filter replaced with a dynamic source follower block in accordance with the present invention.

FIG. 4c illustrates the Dynamic Source Follower 4-7 replacing the RC networks of $C_{n1}$-$R_{n1}$ and $C_{n2}$-$R_{n2}$ along with the devices $N_1$ and $N_2$ given in FIG. 4b. As depicted in FIG. 4c, when the Dynamic Source Follower 4-7 is substituted for the operational amplifier 1-15, the signal $V_{in}$ 4-4 is applied to the positive input Dynamic Source Follower. However, a signal $\overline{V_{in}}$ 4-5 is required for the negative input of the Dynamic Source Follower but is currently not available. As will be seen shortly, this signal is available in a differential filter design. FIG. 4d presents a generalized Sallen-Key filter 4-8 since the resistors and capacitors of FIG. 4c are replaced by impedances.

Figures 5A, 5B:
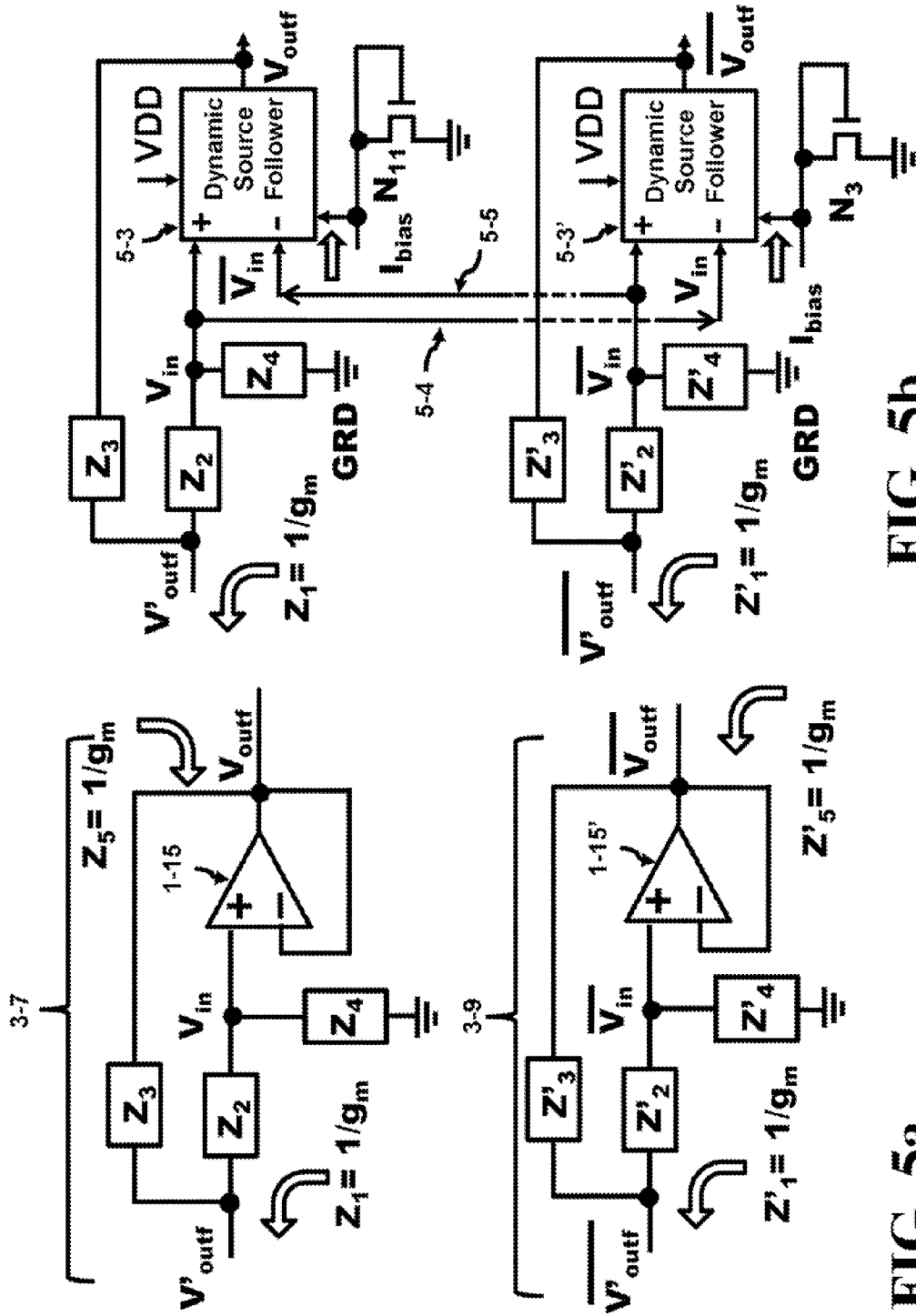
FIG. 5a presents the second cascaded stage of FIG. 3c in accordance with the present invention.
FIG. 5b illustrates the second cascaded stage of FIG. 3c replaced with dynamic source follower blocks in accordance with the present invention.

As depicted in FIG. 5a, a differential Sallen-Key filter (for example, the 3-7 and 3-9 filters of FIG. 3c) generates both signals $\overline{V_{in}}$ and $V_{in}$ internally. As discussed earlier, in order to achieve the negative feedback to the operational amplifier, the negative input to the operational amplifiers would require a feedback signal from the output of the operational amplifier. The operational amplifier 1-15 as illustrated in FIG. 5a requires an internal feedback path to maintain the stability of the operational amplifier. A differential amplifier typically contains several devices, incorporates a input and output stage, and uses an RC feedback path to maintain stability. The device count and feedback adds additional circuit components and limits the high frequency performance of the operational amplifier since the delay in the feedback loop limits the maximum performance that can be achievable in the operational amplifier and ultimately the Sallen-Key filter.

The operational amplifiers 1-15 and 1-15' can be replaced by the Dynamic Source Followers 5-3 and 5-3' as illustrated in FIG. 5b. The current source for the Dynamic Source Followers 5-3 and 5-3' are $N_{11}$ and $N_3$, respectively. In contrast, the Dynamic Source Followers 5-3 and 5-3' in FIG. 5b use feed forward signals to control the filter's operation and each Dynamic Source Follower only requires two devices. Since the Dynamic Source Follower does not use internal feedback and only two devices, the maximum performance limiting the operational amplifier due to the feedback path and large device count has been eliminated and thereby allows the Dynamic Source Follower to achieve a higher performance. In addition, the Dynamic Source Followers 5-3 and 5-3' provide the feed forward signals 5-5 and 5-4 between the differential path. For example, $\overline{V_{in}}$ 5-5 is provided to the negative input of the Dynamic Source Follower 5-3 while $V_{in}$ 5-4 is provided to the negative input of the Dynamic Source Follower 5-3'. Thus, since the operational amplifiers 1-15 and 1-15' have been eliminated thereby eliminating the internal stability feedback loop issue and reducing the device count, the circuit in FIG. 5b should outperform the circuit shown in FIG. 5a since the Dynamic Source Followers only requires a feed forward signal and a minimum of two devices.

Figure 6A:
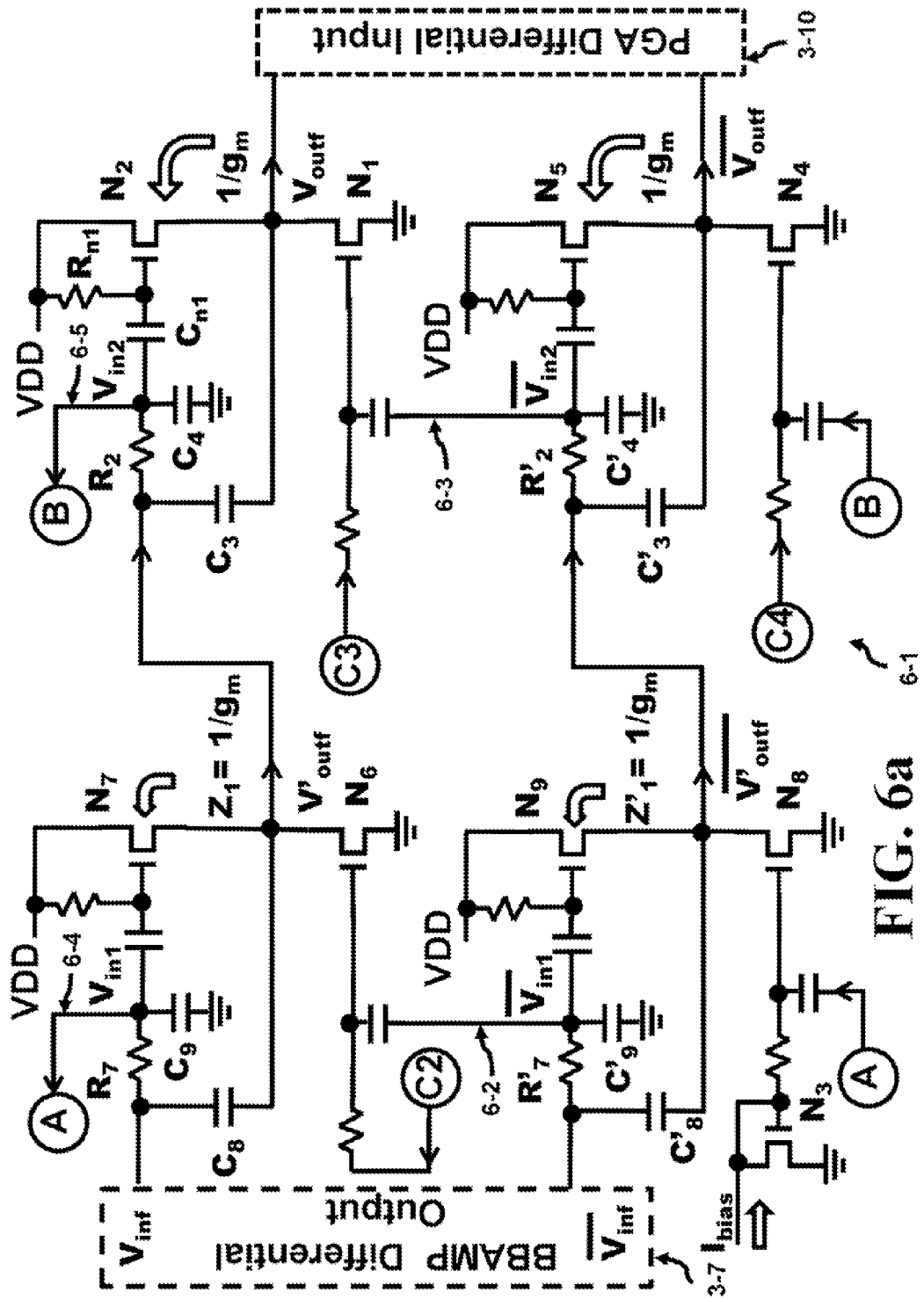
FIG. 6a shows a differential cascaded low pass Sallen-Key filter using the dynamic source follower with the biasing, RC networks and components in accordance with the present invention.

The cascaded differential Sallen-Key filter presented in FIG. 3c when used as a low pass filter 6-1 is further illustrated in FIG. 6a after the operational amplifiers are replaced by the source followers and the impedances replaced by resistors or capacitors to form the LPF. This is one of the circuits used for the LPF 1-6 in FIG. 1. On the left side is the BBAMP Differential Output 3-7 while the right side couples to the PGA Differential Input 3-10. The voltage of the current source caused by $I_{bias}$ is duplicated to devices $N_6$, $N_1$ and $N_4$ through the symbols C2-C4 defined in FIG. 6b. Similar subscript numbers of the impedances correspond to each other in the two FIGS., for example, $Z_8$, $Z_7$, $Z_9$, $Z_3$, $Z_2$ and $Z_4$ in FIG. 3c corresponds to $C_8$, $R_7$, $C_9$, $C_3$, $R_2$ and $C_4$ in FIG. 6a. Each differential section of the Sallen-Key filter contains two cascaded filters. The feedback paths joining the first two differential filters are paths 6-4 (joined by A) and 6-2. The second cascaded differential filters have feedback paths 6-3 and 6-5 (joined by B).

The gain of the second cascaded filter in FIG. 6a is given by equation (2):

$$20 \log\left(\frac{V_{outf} - \overline{V_{outf}}}{V_{outf} - \overline{V'_{outf}}}\right) \cong 6 \text{ dB} \quad (2)$$

while the gain of the first and second cascaded filters are given by (3) as:

$$20 \log\left(\frac{V_{outf} - \overline{V_{outf}}}{V_{inf} - \overline{V_{inf}}}\right) \cong 12 \text{ dB} \quad (3)$$

The cascaded differential LPF Sallen-Key filter is designed to have a cutoff frequency of about 900 MHz. This cutoff is determined by the low pass filter consisting of $Z_1$ (output impedance of the previous filter), $R_2$ and $C_4$. However, $V_{in2}$ is coupled to the device $N_2$ by the high pass filter formed by $C_{n1}$-$R_n$. The high pass filter is designed to pass frequencies greater than 1 to 2 MHz. Thus, the initial 900 MHz bandwidth signal of the Sallen-Key filter is notched out at DC and up to 2 MHz. However, this loss of signal content does not affect the operation of the system since the design can still meet performance specifications. The $I_{bias}$ current can also be adjusted to alter the bandwidth of the overall filter by altering the output impedance of the Dynamic Source Followers $$\left(\frac{1}{g_m}\right)$$

by adjusting the current mrough the four mirrored devices; $N_1$, $N_4$, $N_6$ and $N_8$. The bandwidth of the filter can be changed through $I_{bias}$ to control the $$\frac{1}{g_m}$$

of these four devices.

Figure 6B:
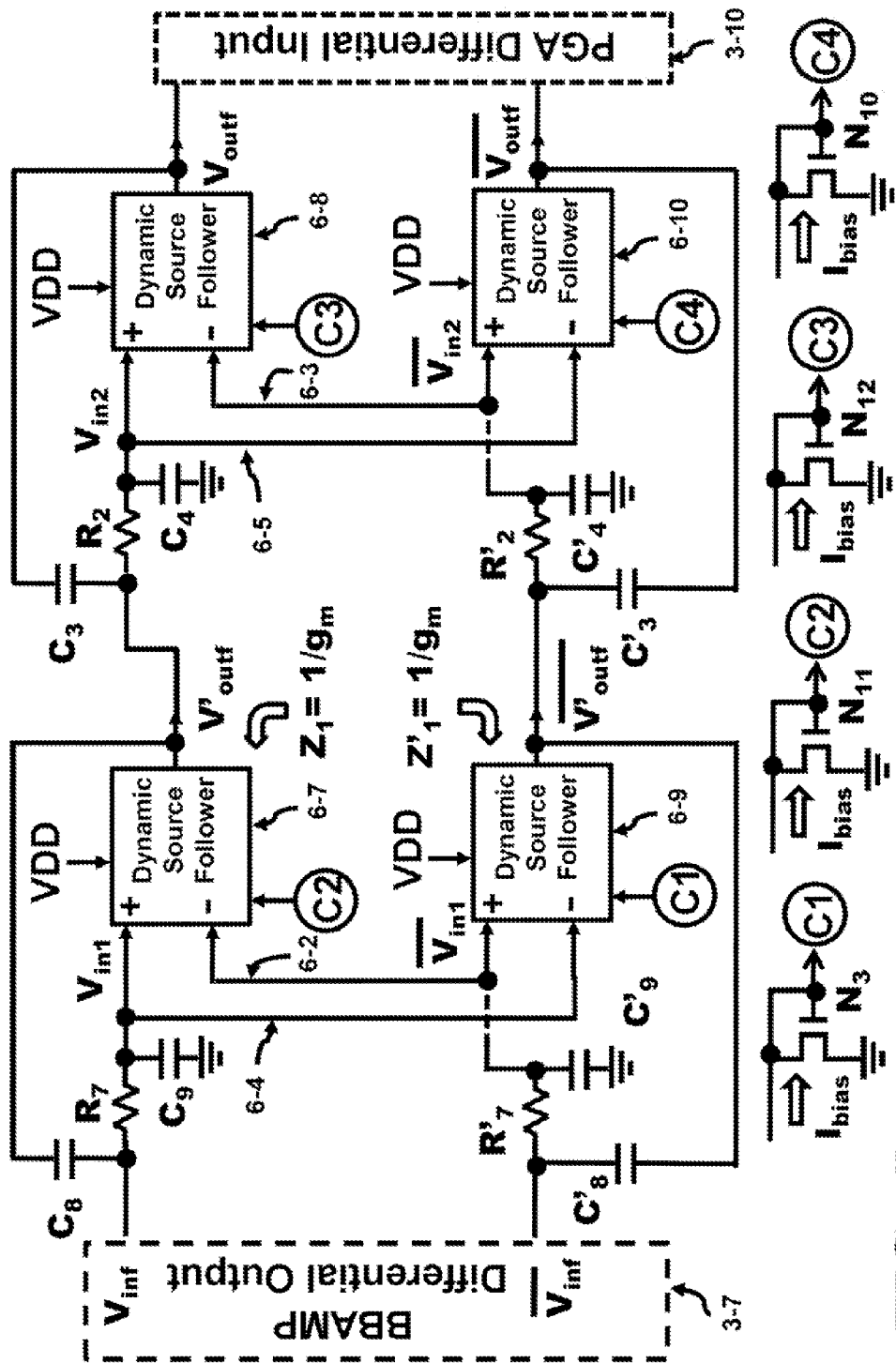
FIG. 6b depicts a differential cascaded low pass Sallen-Key filter with dynamic source follower blocks in accordance with the present invention.

FIG. 6b replaces all four source followers in FIG. 6a with the block symbol Dynamic Source Followers 6-7 through 6-10. The current source for the Dynamic Source Follower 6-9 is connected by $C_1$ to the current source $N_3$, the current source for the Dynamic Source Follower 6-7 is connected by $C_2$ to the current source $N_{11}$, the current source for the Dynamic Source Follower 6-8 is connected by $C_3$ to the current source $N_{12}$, and the current source for the Dynamic Source Follower 6-10 is connected by $C_4$ to the current source $N_{10}$. The feed forward paths 6-4 provides the signal $V_{in1}$ from the positive input of the Dynamic Source Followers 6-7 to the negative input of the Dynamic Source Followers 6-9. Simultaneously, the feed forward paths 6-2 provides the signal $\overline{V_{in1}}$ from the positive input of the Dynamic Source Followers 6-9 to the negative input of the Dynamic Source Followers 6-7. Likewise, in the second differential cascaded filter the feed forward paths 6-5 provides the signal $V_{in2}$ from the positive input of the Dynamic Source Followers 6-8 to the negative input of the Dynamic Source Followers 6-10. Simultaneously, the feed forward path 6-3 provides the signal $\overline{V_{in2}}$ from the positive input of the Dynamic Source Followers 6-10 to the negative input of the Dynamic Source Followers 6-8. Thus, this differential double cascaded Sallen-Kev LPF filter provides gain, increased bandwidth and a more stable system.

Figure 7A:
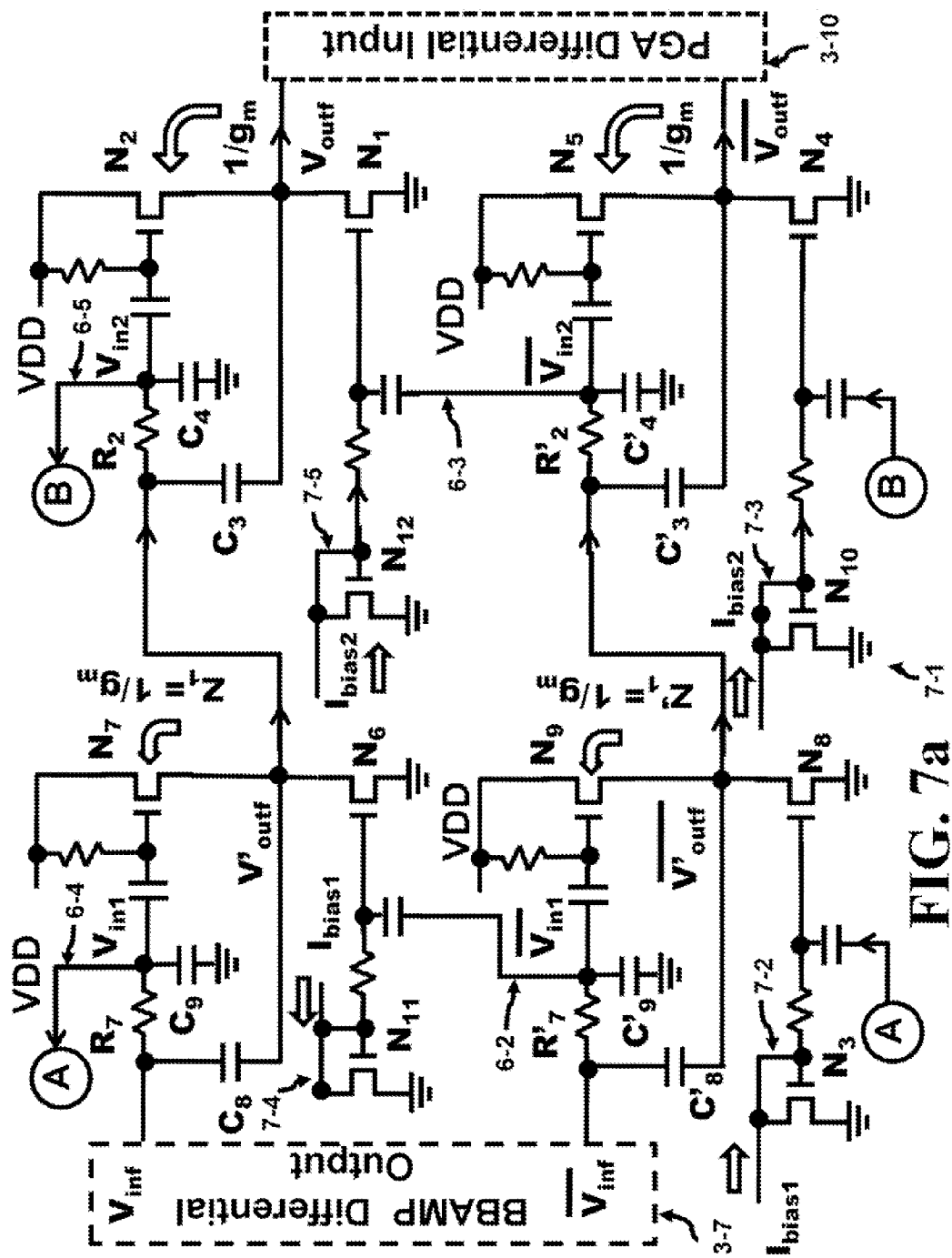
FIG. 7a illustrates a differential cascaded low pass Sallen-Key filter using the dynamic source follower as in FIG. 6a but modified with two independent current biasing voltages and the RC networks and components in accordance with the present invention.

FIG. 7a illustrates a circuit 7-1 where several current bias circuits (7-2 through 7-5) are used. The first bias current $I_{bias1}$ adjusts the $$\frac{1}{g_m}$$

of the first cascaded stage of the filter while the second bias current $I_{bias2}$ adjusts the $$\frac{1}{g_m}$$

of the second cascaded stage of the filter. The two independent controls of the current bias $I_{bias1}$ and $I_{bias2}$ allow the bandwidth of the Sallen-Key filter to be altered in another dimension when compared to the circuit given in FIG. 6a. $I_{bias1}$ controls the $$\frac{1}{g_m}$$

of the first cascaded stage and $I_{bias2}$ control the $$\frac{1}{g_m}$$

of the second cascaded stage. In practice, the $$\frac{1}{g_m}$$

of the first stage is slightly different from the $$\frac{1}{g_m}$$

of the second stage due to loading of PGA Differential Input 3-10. The loading of the PGA 3-10 on the second cascaded Sallen-Key filter is different than the loading the second cascaded Sallen-Key presents to the first cascaded Sallen-Key filter. Thus, the total bandwidth of the entire chain (from BBMAP 3-7, to the first Sallen-Key filter, to the second Sallen-Key filter to the PGA 3-10 and including the A to D (not shown) must be adjusted by the these filter controls. The independent adjustment of the two current biases $I_{bias1}$ and $I_{bias2}$ provides additional control to the adjustment of the bandwidth.

An apparatus comprising: a first device and a second device series coupled between two power supplies, a first AC input signal coupled to said first device, a first DC biasing voltage coupled to said first device, a second AC input signal coupled to said second device, a second DC biasing voltage coupled to said second device, an output signal generated between said series coupled devices and said first device and said second device are same channel type. Further comprising, a first RC network coupling said first AC input signal to said first device said first RC network coupling said first DC biasing voltage to said first device, a second RC network coupling said second AC input signal to said second device and said second RC network coupling said second DC biasing voltage to said second device. Further comprising a reference current and a third device connected in saturation providing load for said reference current, thereby generating said second DC biasing voltage. Further comprising, said first device generates a first output signal component and said second device generates a second output signal component, whereby said first output signal component and said second output signal component combine to generate said output signal. Whereby said second AC input signal is a complement of said first AC input signal whereby said second output signal component is a complement first output signal component and said second output signal component. Whereby said channel type is an N-MOS device and said two power supplies are VDD and GRD.

A differential amplifier comprising: a first upper device and a first lower device series coupled between two power supplies, a second upper device and a second lower device series coupled between said two power supplies, a first DC voltage enables said first upper device and said second upper device, a second DC voltage regulates current flow in said first lower device and said second lower device, said first upper device and said second lower device coupled to an AC signal component, said first lower device and said second upper device coupled to a complement of said AC signal component, a first output signal between said first upper device and said first lower device, a second output signal between said second upper device and said second lower device and all said devices are same channel type, Further comprising a first RC network coupling said AC signal component to said first upper device, a second RC network coupling said AC signal component to said second lower device, a third RC network coupling said complement of said AC signal component to said first lower device and a fourth RC network coupling said complement of said AC signal component to said second upper device. Further comprising said first RC network coupling said first DC voltage component to said first upper device, said second RC network coupling said second DC voltage component to said second lower device, said third RC network coupling said second DC voltage component to said first lower device and said fourth RC network coupling said first DC voltage component to said second upper device. Further comprising a reference current and a first device connected in saturation providing a load for said reference current, thereby generating said second DC voltage component. Whereby all devices are N-MOS devices. Whereby an output signal is generated between said first output signal and said second output signal, Whereby said two power supplies are VDD and GRD.

A differential Sallen-Key filter comprising: a first AC signal coupled to a first impedance, a first AC complementary signal coupled to a second impedance, said first impedance coupled to a third impedance, said second impedance couple to a fourth impedance, said third impedance coupled to a positive input of a first dynamic source follower and to a negative input of a second dynamic source follower, said fourth impedance coupled to a positive input of said second dynamic source follower and a negative input of said first dynamic source follower and an output node of said first dynamic source follower and a complementary output node of said second dynamic source follower generates a differential AC output signal. Further comprising: a fifth impedance coupling said first and third impedances to said output node of said first dynamic source follower, a sixth impedance coupling said first complementary and fourth impedances to said output node of said second dynamic source follower, a seventh impedance coupling said positive input of said first dynamic source follower to ground and an eighth impedance coupling said positive input of said second dynamic source follower to ground. Further comprising: a plurality of reference currents and a plurality of devices connected in saturation providing a load for one of said reference currents and a DC voltage component, whereby said DC voltage component is provided to each dynamic source follower by a different device. Further comprising: two or more differential Sallen-Key filters cascaded in series. Whereby all devices are N-MOS devices. Whereby said dynamic source followers are powered by VDD and ground power supplies.

Finally, it is understood that the above description are only illustrative of the principle of the current invention. Various alterations, improvements, and modifications will occur and are intended to be suggested hereby, and are within the sprit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. Although the circuits were described using CMOS, the same circuit techniques can be applied to depletion mode devices and BJT or bipolar circuits, since this technology allows the formation of current sources and source followers. When a device is specified, the device can be a transistor such as an N-MOS or P-MOS. The CMOS or SOI (Silicon on insulator) technology provides two enhancement mode channel types: N-MOS (n-channel) and P-MOS (p-channel) devices or transistors. The implementation of a low pass Sallen-Kev filter was presented, and a portable system can exchange information wirelessly by using communication techniques such as TDMA Time Division Multi Ile Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. A differential amplifier comprising:
   a first upper device and a first lower device series coupled between two power supplies;
   a second upper device and a second lower device series coupled between said two power supplies;
   a first DC voltage enables said first upper device and said second upper device;
   a second DC voltage regulates current flow in said first lower device and said second lower device;
   said first upper device and said second lower device coupled to an AC signal component;
   said first lower device and said second upper device coupled to a complement of said AC signal component;
   a first output signal between said first upper device and said first lower device;
   a second output signal between said second upper device and said second lower device;
   all said devices are same channel type;
   a first RC network coupling said AC signal component to said first upper device;
   a second RC network coupling said AC signal component to said second lower device;
   a third RC network coupling said complement of said AC signal component to said first lower device;
   and
   a fourth RC network coupling said complement of said AC signal component to said second upper device, whereby said first RC network is equivalent to said fourth RC network and said second RC network is equivalent to said third RC network.

2. The differential amplifier of claim 1, further comprising:
   said first RC network coupling said first DC voltage to said first upper device;
   said second RC network coupling said second DC voltage to said second lower device;
   said third RC network coupling said second DC voltage to said first lower device; and
   said fourth RC network coupling said first DC voltage to said second upper device.

3. The differential amplifier of claim 2, further comprising:
   a reference current; and
   a first device connected in saturation providing a load for said reference current; thereby generating said second DC voltage.

4. The differential amplifier of claim 3, whereby
   all devices are N-MOS devices.

5. The differential amplifier of claim 3, wherein
   a third, output signal is generated between said first output signal and said second output, signal.

6. The differential amplifier of claim 3, whereby
   said two power supplies are VDD and GRD.

7. The differential amplifier of claim 5, wherein
   said first output signal is the inverse of said second output signal.

8. The differential amplifier of claim 7, wherein said third output signal is a differential signal.

9. The differential amplifier of claim 1, wherein said AC signal components are coupled to said upper and lower devices by a corresponding capacitor of said corresponding RC network.

* * * * *